United States Patent [19]

Darrow et al.

[11] Patent Number: 4,676,426
[45] Date of Patent: Jun. 30, 1987

[54] SOLDER LEVELING TECHNIQUE

[75] Inventors: Russell E. Darrow, Endicott, N.Y.; Alan J. Emerick, Warren Center, Pa.; John D. Larnerd, Owego, N.Y.

[73] Assignee: IBM Corp., Armonk, N.Y.

[21] Appl. No.: 837,817

[22] Filed: Mar. 10, 1986

[51] Int. Cl.[4] .............................. B23K 31/00
[52] U.S. Cl. ...................... 228/125; 228/180.1; 228/19
[58] Field of Search ............ 228/125, 180.1, 19, 228/20; 427/367, 376.8

[56] References Cited

U.S. PATENT DOCUMENTS

| | | |
|---|---|---|
| 3,834,015 | 9/1974 | Di Renzo . |
| 4,083,323 | 4/1978 | Rote . |
| 4,101,066 | 7/1978 | Corsaro et al. . |
| 4,196,839 | 4/1980 | Davis . |
| 4,311,266 | 1/1982 | Kondo . |
| 4,354,292 | 10/1982 | Telestad et al. . |
| 4,401,253 | 8/1983 | O'Rourke . |
| 4,402,448 | 9/1983 | O'Rourke . |
| 4,408,560 | 10/1983 | Caratsch . |
| 4,410,126 | 10/1983 | O'Rourke . |
| 4,463,891 | 9/1983 | Scheible et al. . |
| 4,465,219 | 8/1984 | Kodo . |
| 4,469,716 | 9/1984 | Caratsch . |
| 4,501,770 | 2/1985 | Bajka et al. . |
| 4,530,457 | 7/1985 | Doun .................. 228/37 |

Primary Examiner—Nichols P. Godici
Assistant Examiner—Karen Skillman
Attorney, Agent, or Firm—Perman & Green

[57] ABSTRACT

A method of solder leveling in printed circuit boards or other circuitized substrates. Flux is first applied to the surface of the substrate to be soldered. Molten solder is then applied to the fluxed surface after which the soldered substrate is cooled to a temperature below 300° F. Molten solder is then again applied to the previously soldered surface of the substrate. This last step results in leveling the solder first applied to the substrate, including removal of any solder balls which had been formed over recessed pins and flush filling of passage holes formed in the substrate. The method can be performed without regard to the surface condition of the substrate, the composition of flux and solder, whether the substrate is of the thin film type or of the thick film type, nor whether dip soldering or wave soldering techniques are used. The invention also incompasses the end product resulting from use of the method.

2 Claims, 4 Drawing Figures

SOLDER LEVELING TECHNIQUE

BACKGROUND OF THE INVENTION

I. Field of the Invention

This invention relates to a method of solder leveling on a printed circuit board or any other circuitized substrate and particularly to a method of producing flush solder fill over recessed substrate pins and over passage holes in the substrate.

II. Description of the Prior Art

Various soldering systems are well known in the art for mass soldering electrical and electronic components, by their leads, onto printed circuit boards. One technique for mass soldering components to circuit boards is that of dip soldering. With this technique, the entire side of a circuit board containing the printing wiring, with the leads from the components projecting through apertures in the board, is engaged for a certain period of time with the surface of a bath of molten solder, and then removed. Another technique for mass soldering components onto circuit boards is that of wave soldering. A typical prior art wave soldering system generally comprises a container adapted to hold a supply of molten solder and a sump partially submerged in the molten solder. The sump has an intake orifice below the surface of molten solder, and an elongated horizontal nozzle or slot above the surface of the solder. A positive displacement pump is submerged in the body of solder and is adapted to force molten solder into the sump intake orifice, where the molten solder then flows upward in the sump and out the horizontal nozzle to thereby produce a smoothly rounded standing wave of molten solder above the nozzle.

Other techniques for mass soldering electrical and electronic components onto printed circuit boards are well known in the art and include cascade soldering, jet soldering and drag soldering. So-called "leadless" components such as flat packs can also be mass soldered to circuit boards by fixing the components to the bottom of a board, e.g. as by fixturing or with an adhesive, and then engaging the bottom of the board and the components with molten solder. While known mass soldering systems have provided substantial manufacturing economy to the electronics industry and thus achieved substantial commercial use, the deposition of excess solder on the board circuits, connections and leads has been a continual problem. Deposition of excess solder may result in formation of shorts, icicles and/or bridges, and will increase solder consumption and finished board weight. Moreover, current trends in the electronics industry to relatively high density electronic assemblies has increased the problem of solder shorts, icicling and bridging.

The prior art has devised various techniques to solve the problems of solder shorts, icicling and bridging. For example, for wave soldering, one technique which has become virtually universally adopted by the industry is to incline the travel path of the circuit boards through the solder wave, i.e. from the horizontal, to increase the exit angle between a board being soldered and the solder wave. The art has also devised various wave geometries for further increasing the exit angle and/or changing the point where a circuit board exits the wave. Another system for reducing the incidence of solder shorts, icicling and bridging which has achieved substantial commercial acceptance, is to intimately mix soldering oil in the solder wave in accordance with the teachings of Walker et al, U.S. Pat. No. 3,058,441. While such systems have been found to reduce substantially the incidence of solder shorts, bridging and/or icicling, such systems have not entirely eliminated solder shorts, bridges and icicling, particularly in cases where relatively high density electronic assemblies and/or relatively long lead components are being soldered to circuit boards.

Another difficulty commonly encountered has been the inability to control the solder level over a recessed pin in the substrate. It usually occurs that when soldering is performed on the surface of a substrate with flushed pins positioned thereon, a solder ball results on the pin head with consequent waste of solder and causing interference with other components to be mounted on the board. Previous expedients for counteracting or leveling the solder balls which resulted from the soldering operation have included brushing the solder while still molten and milling the solder after it cools and hardens. Both of these expedients are relatively difficult to achieve in the confined space on the surface of a circuit board and relatively expensive because of the individualized nature of each operation.

A number of patents typify the prior art relating to leveling of solder on a circuit board and removal of excess solder. U.S. Pat. No. 4,083,323 discloses the use of opposed gas knives to remove excess molten solder from a printed circuit board as the board is being withdrawn from a bath of molten solder. According to U.S. Pat. No. 4,101,066, a circuit board is advanced along a predetermined path so that it engages, in rapid succession, a pair of solder waves flowing in opposite directions, an expedient which is said to reduce crossovers or bridges between the terminals and the conductor of paths. A mechanical expedient in the form of cleaning bands provided with bristles to clean the circuit board of soldering and resin remnants arising when soldering components on the board is disclosed in U.S. Pat. No. 4,354,292. According to U.S. Pat. Nos. 4,401,253, 4,402,448, 4,410,126, and 4,469,716, a fluid stream is directed onto a circuit board immediately following deposition of molten solder onto the board, for eliminating excess solder before it solidifies as shorts, icicles, or bridges. Hot oil is appled to the circuit board surface while solder previously applied is still molten to help alleviate the problem of solder icicles, bridging, etc. according to U.S. Pat. No. 4,463,891. Yet another expedient, namely that of rapid de-acceleration and impact of the frame holding a circuit board to thereby dislodge excess solder, is presented in U.S. Pat. No. 4,501,770.

However, as noted above, many of these expedients require complex machinery with the high cost associated therewith, or do not readily lend themselves to high volume, mass production operations, or are not completely effective in achieving the solder leveling and remnant removal which is necessary in order to achieve an end product which is of high quality.

SUMMARY OF THE INVENTION

It was with knowledge of the prior art and the problems existing which gave rise to the present invention. In brief, the present invention is directed towards an improved method of solder leveling in printed circuit boards or other circuitized materials. According to this improved method, flux is first applied to the surface of the substrate to be soldered. Molten solder is then applied to the fluxed surface after which the soldered substrate is cooled to a temperature below 300° F. so that the solder on the substrate returns to a solid state. Molten solder is then again applied to the previously soldered surface of the substrate. This last step results in leveling the solder first applied to the substrate, including removal of any solder balls which had been formed over recessed pins and flush filling of passage holes formed in the substrate. The method can be performed without regard to the surface condition of the substrate, composition of flux and solder, whether the substrate is of the thin film type or of the thick film type, nor whether dip soldering or wave soldering techniques are used. The invention also encompasses the end product resulting from use of the method.

The method of the invention simplifies known procedures, can be inexpensively performed, and results in a significantly improved end product.

Other and further features, objects, advantages, and benefits of the invention will become apparent from the following description taken in conjunction with the following drawings. It is to be understood that both the foregoing general description and the following detailed description are exemplary and explanatory but not restrictive of the invention. The accompanying drawings, which are incorporated in and constitute a part of this invention, illustrate some of the embodiments of the invention and, together with the description, serve to explain the principles of the invention in general terms. Throughout the disclosure, like numerals refer to like parts.

DESCRIPTION OF THE PREFERRED EMBODIMENT

Figure 1:
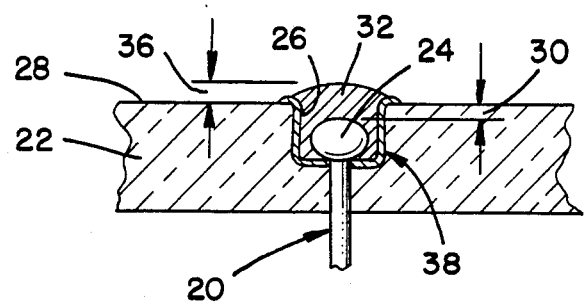
FIG. 1 is a detail cross section view in elevation of a portion of a circuitized substrate with a recessed soldered mounting pin thereon.

The present invention is a culmination of efforts to develop a method of controlling the solder level over a recessed pin in a substrate. With attention directed to FIG. 1, a mounting pin 20, typically composed of copper, or at least copper coated, is mounted on a substrate 22 which is of a dielectric material such as ceramics or of a glass/polymer base composition. In typical fashion, the mounting pin 20 has a head 24 which is received in a recess 26 formed in an upper surface 28 of the substrate. In order to meet the requirements of one specification customarily used in the industry, the height of the head 24 can vary between being flush with the upper surface 28 to being 0.004 inches below the surface 28. This tolerance range is represented by a reference numeral 30 in FIG. 1. By this same specification, after solder 32 has been applied to the substrate 22 so as to overlie and conceal the head 24, the solder level should not be higher than 0.001 inches above the surface 28.

In FIG. 1, the incremental distance above the surface 28 representing a maximum height of the solder is represented by a reference numeral 36. In the past, these tolerances were maintained by brushing the solder while it was still in the molten state, or by milling. However both of these techniques had drawbacks which are eliminated by the present invention. It should be understood that for ease of illustration, the substrate 22 is illustrated without any coating on its upper surface 28, although metallization 38 is generally indicated in the immediate region of the recess 26. In actual practice, the upper surface is usually coated as will be described below.

According to the invention, a flux agent is first applied to those surfaces of the substrate 22 on which solder is to be coated. Basically, fluxes are materials that remove contamination from the surface of a material to be soldered so that wetting can occur. The flux agent breaks up and removes tarnish layers on the copper surfaces either by chemical combination or by chemical reduction. The flux agent also has to protect the surface of the metal during the soldering action. An example of a suitable flux is that manufactured by Alpha Metals as Flux Type Alpha 100, although numerous other types and sources could be utilized.

The flux agent is applied in a controlled application and may be foam or brush applied to assure wetting of the entire surface 28 of the substrate 22.

Thereupon, molten solder is applied to the fluxed outer surface of the substrate 22. As illustrated in FIG. 1, diagrammatically for purposes of explanation, the substrate has only been fluxed in the region overlying the head 24 of the mounting pin 20.

Figure 2:
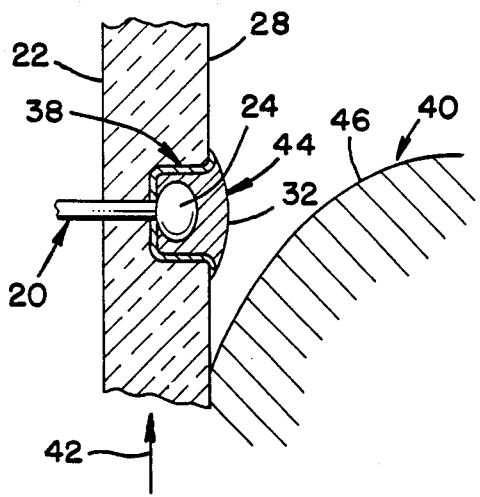
FIG. 2 is s detail cross section view, in elevation, illustrating withdrawal of the circuitized substrate of FIG. 1 from a solder bath following a first immersion therein.

FIG. 2 represents withdrawal of the substrate 22 from a molten solder bath 40 in the direction of an arrow 42. Of course, it should be understood that other techniques of applying molten solder to the substrate 22 can be used, such as wave soldering. However, the end result will be the same regardless of the particular solder application technique which is employed.

In any event, viewing FIG. 2, as the substrate 22 is withdrawn from the molten solder bath 40, a solder ball 44 is formed over the head 24. A meniscus 46 defining the surface of the solder bath 40 is of the convex shape illustrated in FIG. 2 because of negative surface tension which occurs at the surface of the solder bath. This is the result of a known phenomenon which occurs when flux residue including polymerized flux agent rises to the surface of the solder bath when the substrate is immersed therein. Desirably, no flux remains on the surface 28 when the substrate 22 is removed from the solder bath 40.

Following removal of the substrate 28 from the solder bath 40, the solder coated thereon, as represented by the solder ball 44, is allowed to cool in air and solidifies at a temperature of something less than 300° F. in air.

Following solidification of the solder ball 44, the substrate 22 is re-immersed in the solder bath 40, then again withdrawn from the solder bath, generally in the direction of the arrow 42. It is preferred, for purposes of a dip process, that the substrate 22 be maintained within a range of +/−20° from a perpendicular to the solder surface as it is being withdrawn. Additionally the rate of withdrawal is important, being, preferably, within the range of 0.05 to 0.20 inches per second. It is also desirable to agitate the substrate 22 in a known fashion during its withdrawal from the solder bath 40 in order to remove foreign particles as well as any solder which has solidified in the form of shorts, icicles, or bridges.

Figure 3:
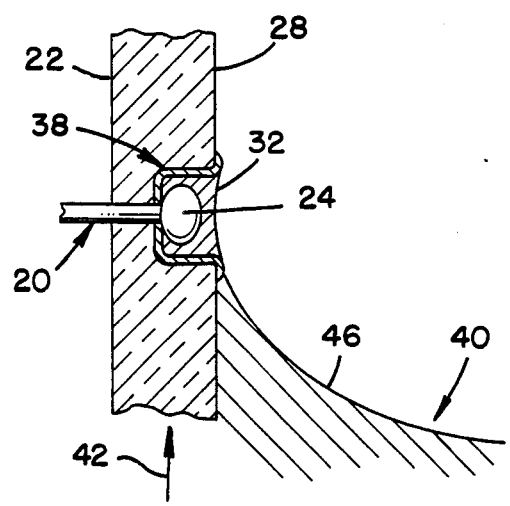
FIG. 3 is a detail cross section view, in elevation, similar to FIG. 2, illustrating withdrawal of the circuitized substrate from the solder bath following a second immersion therein.

Viewing FIG. 3, it will be appreciated that as the substrate 22 is withdrawn from the solder bath 40, the meniscus 46 of the molten or liquid solder within the bath 40, now exhibits a concave shape representing a return to positive surface tension because the flux residue and polymerized flux agent will preferably have been removed prior to the re-immersion step. In any event, as the substrate 22 is withdrawn from the solder bath 40, this altered surface tension serves to "wipe" the upper surface 28 leaving the solder 32 over the head 24 of the pin 20 substantially flush with the surface 28. It is theorized that this effect is a result of the initial coating of flux agent being polymerized during the initial solder application step.

A variety of solder compositions can be employed for purposes of the method of the invention, although temperature ranges for the solder bath 40 will vary according to the particular composition used. The following Table 1 is illustrative of the temperature range which is preferable for different solder compositions utilized for the first immersion step:

TABLE 1

| SOLDER COMPOSITION tin/lead | RANGE OF bath temps. |
|---|---|
| 10/90 | 324° C.–336° C. |
| 5/95 | 325° C.–355° C. |
| 3/97 | 330° C.–360° C. |

Figure 4:
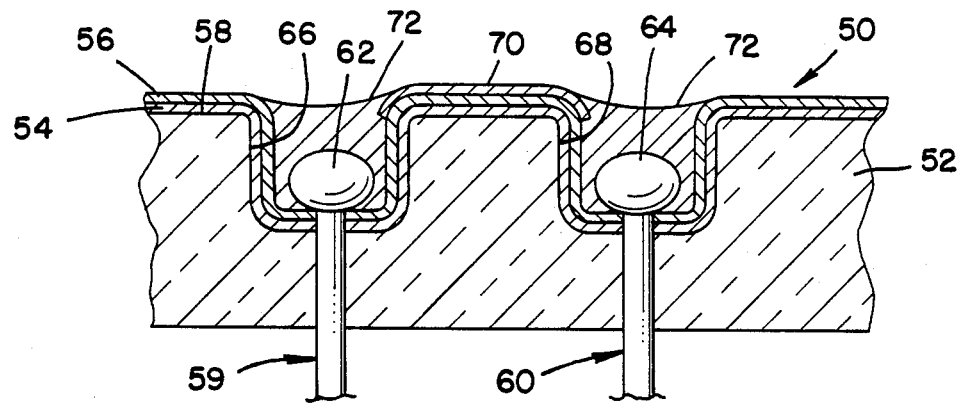
FIG. 4 is a detail cross section view, in elevation, of a portion of a circuitized substrate provided with metallurgy and a pair of recessed monitoring pins thereon, and embodying the invention.

It is also noteworthy that the invention is not limited to the particular solder compositions noted above; they are merely representative of some of the compositions which can be employed. Additionally, the method of the invention is applicable to substrates having a host of surface conditions ranging from those with only metallurgy in the recessed holes to full metallurgy as typically represented by the printed circuit board or ceramic substrate 50 illustrated in FIG. 4. The circuit board or ceramic substrate 50 is comprised of a structural material 52 and layers of chromium and copper, 54 and 56, respectively, which have been applied to an upper surface 58 of the material. Also illustrated in FIG. 4, are a pair of pins 59 and 60 having heads 62 and 64, respectively, received within recesses 66 and 68, respectively, in the upper surface 58 of the material 52.

In a known manner, a chromium strip 70 overlies the layers 54 and 56 intermediate the recesses 66 and 68. With solder 72 positioned in the recesses 66 and 68, electrical continuity is assured between the pins 59 and 60. The substantially flush outer surface of the solder 72 filling each recess is indicative of the results obtained by reason of the invention.

It will also be appreciated that the invention is not limited to substrates having particular surface conditions. For example, the outer surface of the substrate may be rough or smooth and it may be regular or irregular. Also, the invention can be used for reducing variations of solder height when mounting device joining pads on a circuit board, can help eliminate solder bridging and lead excess problems during wave soldering. Additionally, the invention will allow the filling of passage holes and leveling them to the level of the outer surface of the substrate or any other desired level. Of course, the invention is also applicable to leveling solder at all locations on the solder surface of the substrate.

While the preferred embodiments of the invention have been disclosed in detail, it should be understood by those skilled in the art that various modifications may be made to the illustrated embodiments without departing from the scope as described in the specification and defined in the appended claims.

We claim:

1. A method of solder leveling in a circuitized substrate to produce substantially flush solder fill over pins recessed in the substrate comprising the steps of:
    applying a flux agent to the outer surface of the substrate;
    immersing the substrate in a molten solder bath;
    removing the substrate from the solder bath;
    air cooling the fluxed and soldered substrate to a temperature below approximately 300° F.;
    re-immersing the substrate in a molten solder bath; and
    withdrawing the substrate from the molten solder bath at a rate lying within the range of 0.05 inches per second and 0.20 inches per second;
    the orientation of the substrate as it is withdrawn after the re-immersing step being within the range of +/−20° from lying in a plane perpendicular to the surface of the solder bath thereby removing any solder balls which formed over the recessed pins following the initial application of solder and resulting in a substantially flush solder fill over the recessed pins.

2. A method as set forth in claim 1 including the step of agitating the substrate concurrently with the step of re-immersing the substrate in a molten solder bath.

* * * * *